US009635298B2

(12) United States Patent
Nakamura et al.

(10) Patent No.: US 9,635,298 B2
(45) Date of Patent: Apr. 25, 2017

(54) COMPARATOR CIRCUIT, IMAGING APPARATUS USING THE SAME, AND METHOD OF CONTROLLING COMPARATOR CIRCUIT

(71) Applicant: CANON KABUSHIKI KAISHA, Tokyo (JP)

(72) Inventors: Kohichi Nakamura, Kawasaki (JP); Hideo Kobayashi, Tokyo (JP); Hiroki Hiyama, Sagamihara (JP); Kazuo Yamazaki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/517,794

(22) Filed: Oct. 17, 2014

(65) Prior Publication Data
US 2015/0138411 A1 May 21, 2015

(30) Foreign Application Priority Data
Nov. 15, 2013 (JP) ................................. 2013-236462

(51) Int. Cl.
*H04N 5/335* (2011.01)
*H04N 5/378* (2011.01)
(Continued)

(52) U.S. Cl.
CPC ............. *H04N 5/378* (2013.01); *H03K 5/125* (2013.01); *H03K 5/249* (2013.01);
(Continued)

(58) Field of Classification Search
USPC ........................................................ 348/300
See application file for complete search history.

(56) References Cited

U.S. PATENT DOCUMENTS 4,798,987 A    1/1989  Nakamura
5,144,466 A    9/1992  Nakamura et al.
(Continued)

FOREIGN PATENT DOCUMENTS

JP    05-83095 A      4/1993
JP    2010-016656 A   1/2010

OTHER PUBLICATIONS

Seunghyun Lim et al., "A High-Speed CMOS Image Sensor With Column-Parallel Two-Step Single-Slope ADCs", Mar. 2009, pp. 393 to 398, vol. 56, No. 3, IEEE Transactions on Electron Devices.
(Continued)

*Primary Examiner* — Stephen Coleman
(74) *Attorney, Agent, or Firm* — Fitzpatrick, Cella, Harper & Scinto

(57) ABSTRACT

An object of the present invention is to provide a comparator which has an input voltage range larger than the case where a conventional offset cancel technique is used, while reducing an offset voltage. A comparator circuit includes: a comparator having an inverting input terminal, a non-inverting input terminal and an output terminal; a first switch having one terminal connected to the inverting input terminal and having the other terminal connected to the output terminal; a first capacitor which has one end connected with the inverting input terminal; a first signal input terminal which is another end of the first capacitor; and a second signal input terminal which selectively inputs either one of a fixed voltage and a comparing signal into the non-inverting input terminal.

8 Claims, 13 Drawing Sheets

(51) Int. Cl.
  *H03K 5/24* (2006.01)
  *H03K 5/125* (2006.01)
  *H04N 5/3745* (2011.01)
  *H03M 1/12* (2006.01)
  *H03M 1/56* (2006.01)

(52) U.S. Cl.
  CPC ....... *H04N 5/3745* (2013.01); *H04N 5/37455* (2013.01); *H03M 1/1295* (2013.01); *H03M 1/56* (2013.01)

(56) References Cited

U.S. PATENT DOCUMENTS

| | | |
|---|---|---|
| 5,153,829 A | 10/1992 | Furuya et al. |
| 5,200,663 A | 4/1993 | Mochizuki et al. |
| 5,285,059 A | 2/1994 | Nakata et al. |
| 5,343,314 A | 8/1994 | Nakamura et al. |
| 5,367,216 A | 11/1994 | Egara et al. |
| 5,845,137 A | 12/1998 | Tanaka |
| 7,109,718 B2 | 9/2006 | Shimizu et al. |
| 7,479,916 B1 | 1/2009 | Reshef et al. |
| 7,701,138 B2 | 4/2010 | Hashimoto et al. |
| 8,259,196 B2 | 9/2012 | Yoshikawa et al. |
| 8,365,615 B2 | 2/2013 | Sato et al. |
| 8,436,535 B2 | 5/2013 | Hashimoto et al. |
| 2012/0089243 A1 | 4/2012 | Kobayashi |
| 2012/0211643 A1 | 8/2012 | Ikeda et al. |
| 2014/0016007 A1 | 1/2014 | Ogura et al. |
| 2014/0176975 A1 | 6/2014 | Kobayashi et al. |

OTHER PUBLICATIONS

Jongwoo Lee et al., "A 2.5 mW 80 dB DR 36 dB SNDR 22 MS/s Logarithmic Pipeline ADC", Oct. 2009, pp. 2755 to 2765, vol. 44, No. 10, IEEE Journal of Solid-State Circuits.

Han S.W. et al., "Area-Efficient Correlated Double Sampling Scheme with Single Sampling Capacitor for CMOS Image Sensors", Mar. 16, 2006, 2 pgs, vol. 42, No. 6, Electronics Letters.

European Office Action dated Mar. 5, 2015 from counterpart European Patent Application No. 14189996.3.

COMPARATOR CIRCUIT, IMAGING APPARATUS USING THE SAME, AND METHOD OF CONTROLLING COMPARATOR CIRCUIT

BACKGROUND OF THE INVENTION

Field of the Invention

The present invention relates to a comparator circuit, an imaging apparatus using the same, and a method of controlling the comparator circuit.

Description of the Related Art

Generally, a configuration of an analog-digital (A/D) converter includes a comparator. The A/D converter is used, for instance, for an imaging apparatus. For the imaging apparatus, there is a technique of connecting the A/D converter to each column of pixels arranged in rows and columns, and converting an analog signal output from each of the pixels into digital data by the A/D converter. Some A/D converters include a differential-input and single-end-output type comparator. There is a variation of offset voltage between input terminals of each of the comparators, among each of the columns. As a method of reducing this variation, a technique is known which cancels an offset voltage as described in Japanese Patent Application Laid-Open No. 2010-16656.

However, in an offset voltage canceling method described in Japanese Patent Application Laid-Open No. 2010-16656, an input voltage range of the comparator is limited depending on a voltage between a gate and a source of a transistor which constitutes a current mirror circuit of a comparator. For this reason, depending on the performance of the transistor, the input voltage range of the comparator may not be sufficiently wide with respect to the input voltage range of the pixel signal.

SUMMARY OF THE INVENTION

According to an aspect of the present invention, a comparator circuit comprises: a comparator having an inverting input terminal, a non-inverting input terminal and an output terminal; a first switch having terminals, one terminal of the terminals connected to the inverting terminal, the other terminal of the terminals connected to the output terminal; a first capacitor having terminals, one terminal of the terminals receiving an analog signal, the other terminal of the terminals being connected to the inverting input terminal and the one terminal of the first switch; a second capacitor having terminals, one terminal of the terminals being connected to the non-inverting terminal, the other terminal of the terminals receiving a comparing signal; and a second switch having terminals, one terminal of the terminals being connected to the one terminal of the second capacitor and the non-inverting terminal, the other terminal of the terminals receiving a fixed voltage.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

(First Embodiment)

Figure 1:
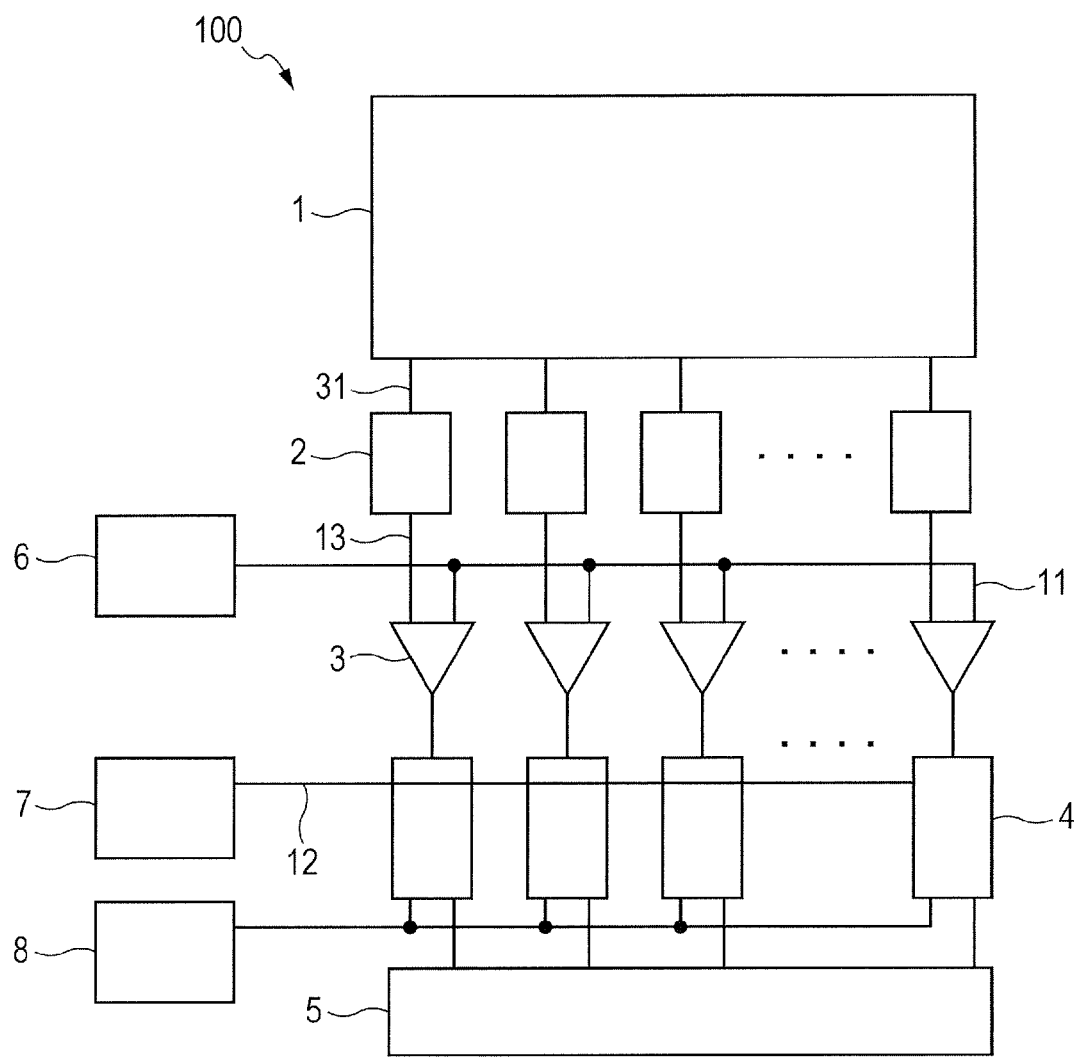
FIG. 1 is a schematic view illustrating a circuit configuration of an imaging apparatus according to a first embodiment of the present invention.

An imaging apparatus according to a first embodiment of the present invention and a comparator which is included in an A/D converter provided in each column of the imaging apparatus will be described below. FIG. 1 is a schematic view illustrating a circuit configuration of an imaging apparatus according to the first embodiment of the present invention. An imaging apparatus 100 includes: a pixel unit 1, a plurality of readout circuits 2, a plurality of comparing units 3, a plurality of storage units 4, a horizontal scanning circuit 5, a reference signal generating unit 6, a counter circuit 7, and a signal processing circuit 8.

The pixel unit 1 includes a plurality of pixels arranged in rows and columns. Each of the pixels outputs signals to a plurality of output lines 31 of the pixel signal, which is arranged for every pixel line, respectively.

Each of the readout circuits 2 is connected to each of the pixel columns in the pixel unit 1 through each of the output lines 31 of the pixel signal, and receives input signals. Each of the readout circuits 2 receives the input signal from the pixel unit 1, subjects the signal to the processing of amplification, and outputs the processed signal to the signal input terminal of each of the comparing units 3 by each of the readout signal output lines 13.

The reference signal generating unit 6 selectively generates any one of a fixed voltage and a ramp signal that is a comparing signal, which are used as the reference signal at the time of the A/D conversion; and outputs the generated signal to each of the comparing units 3 through a RAMP wiring 11. The ramp signal has a waveform such as a saw-tooth wave, which represents the potential monotonically increasing or decreasing over time.

Each of the comparing units 3 is a comparator circuit which includes a differential-input and single-end-output type comparator. Each of the comparing units 3 has two differential signal input terminals and one signal output terminal, and the terminals are connected to the differential input terminals and the output terminal of the comparator, respectively. One of the differential input terminals of the comparing unit 3 is connected to each of the readout circuits 2 by the output line 13 of the readout circuit, and the other end is connected to the reference signal generating unit 6 through the RAMP wiring 11. Each of the comparing units 3 compares the signal input from the output line 13 of the readout circuit with the ramp signal input from the RAMP wiring 11, and outputs the signal according to the comparison result to each of the storage units 4.

Each of the storage units 4 is connected to the output terminal of each of the comparing units 3, the horizontal scanning circuit 5, the counter circuit 7, and the signal processing circuit 8. Each of the storage units 4 converts the output signal from each of the comparing units 3 into digital data, with reference to a counter signal input from the counter circuit 7, and stores the converted digital data therein. The digital data stored in each of the storage units 4 is transferred to the signal processing circuit 8 based on a signal sent from the horizontal scanning circuit 5, and is subjected to signal processing.

Next, the outline of the A/D conversion which is performed in the circuit of the imaging apparatus 100 will be described. The output signal of the readout circuit 2 is input into one differential input terminal of the comparing unit 3, and the ramp signal which is generated in the reference signal generating unit 6 is input into the other differential input terminal, through the RAMP wiring 11. The comparing unit 3 compares the potential of the signal output from the readout circuit 2 with the potential of the ramp signal, and outputs a signal having a potential of a High level or a Low level to the storage unit 4 according to the comparison result. When the relationship of the magnitude between the potential of the signal output from the readout circuit 2 and the potential of the ramp signal which changes with the time is inverted, the potential of the signal which is output to the storage unit 4 from the comparing unit 3 is shifted to Low from High or High from Low. On the other hand, the counter circuit 7 outputs a count value which changes with the time, to each of the storage units 4 through a count data wiring 12. The storage unit 4 stores the counter value which is output from the counter circuit 7 as the digital data therein, at such a timing that the output potential of the comparing unit 3 is inverted. In this way, the A/D conversion is accomplished which converts the signal output from the readout circuit 2 into the digital data and stores the converted digital data in the storage unit 4.

The reset signal and the pixel signal in each of the pixels are subjected to this A/D conversion, and are converted into the digital data. The digital data stored in the storage unit 4 is sequentially transferred to the signal processing circuit 8 in each of the pixel columns, in response to the signal output from the horizontal scanning circuit 5. The signal processing circuit 8 performs the signal processing to acquire a difference between digital data corresponding to the reset signal and digital data corresponding to the pixel signal. Thereby, digital CDS (digital correlated double sampling) is achieved.

Figure 2A:
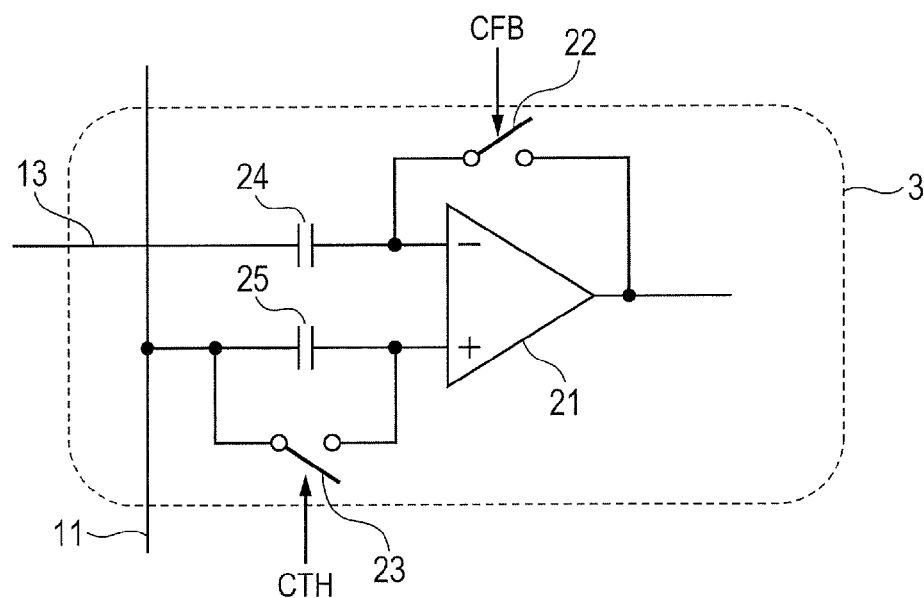
FIGS. 2A and 2B are views illustrating a circuit configuration of a comparing unit (A) and a comparator (B) according to the first embodiment of the present invention.

FIG. 2A illustrates a circuit configuration of the comparing unit 3 according to the first embodiment of the present invention. The comparing unit 3 includes a comparator 21, an FB switch 22, a TH switch 23, a first input capacitor 24 and a second input capacitor 25.

The comparator 21 includes two differential input terminals of a non-inverting input terminal and an inverting input terminal, and one output terminal. In addition, the comparator 21 has positive and negative power supply terminals which supply an electric power, but the illustration is omitted in the figure. One end of the FB switch 22 is connected to the output terminal of the comparator 21, and the other end is connected to the inverting input terminal of the comparator 21 and one end of the first input capacitor 24. The other end of the first input capacitor 24 is connected to the inverting input terminal of the comparator 21 and the FB switch 22, and the other end is connected to the output line 13 of the readout circuit. The TH switch 23 and the second input capacitor 25 are connected in parallel, and respective one ends are connected to the non-inverting input terminal of the comparator 21. The RAMP wiring 11 is connected to the other ends of the TH switch 23 and the second input capacitor 25. The ON (conducting state) operation or OFF (non-conducting state) operation of the FB switch 22 is controlled by a control signal CFB, and the ON or OFF operation of the TH switch 23 is controlled by a control signal CTH. Incidentally, in the description of the present embodiment, any one of the FB switch 22 and the TH switch 23 shall be turned ON when the potential of the control signal is set at High.

Figure 2B:
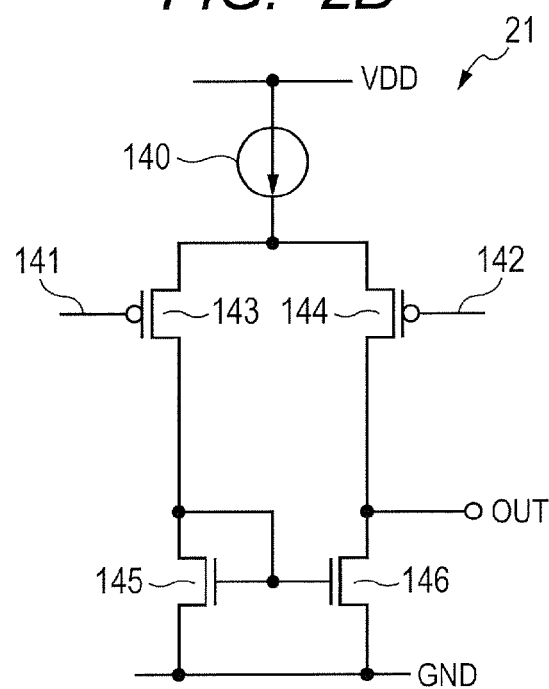

FIG. 2B is a view illustrating a circuit configuration of the comparator 21. The comparator 21 includes transistors 143 and 144 which are P-channel type FETs (Field Effect Transistor), and transistors 145 and 146 which are N-channel type FETs. The comparator 21 is formed of a differential amplifier circuit which uses a current mirror circuit. A current source 140 which applies an electric current to the circuit is connected to a commonized source terminal of the transistors 143 and 144. The gate terminals of the transistors 143 and 144 constitute an inverting input terminal 142 and a non-inverting input terminal 141 of the comparator 21, respectively. A drain terminal and the gate terminal of a diode-connected transistor 145 are connected to the drain terminal of the transistor 143 of which the gate terminal is the non-inverting input terminal 141. The drain terminal of a transistor 146 is connected to the drain terminal of the transistor 144 of which the gate terminal is the inverting input terminal 142, and this connecting wire constitutes an output terminal OUT of the comparator 21. In addition, the gate terminals of the transistors 145 and 146 are connected to each other.

Figure 3:
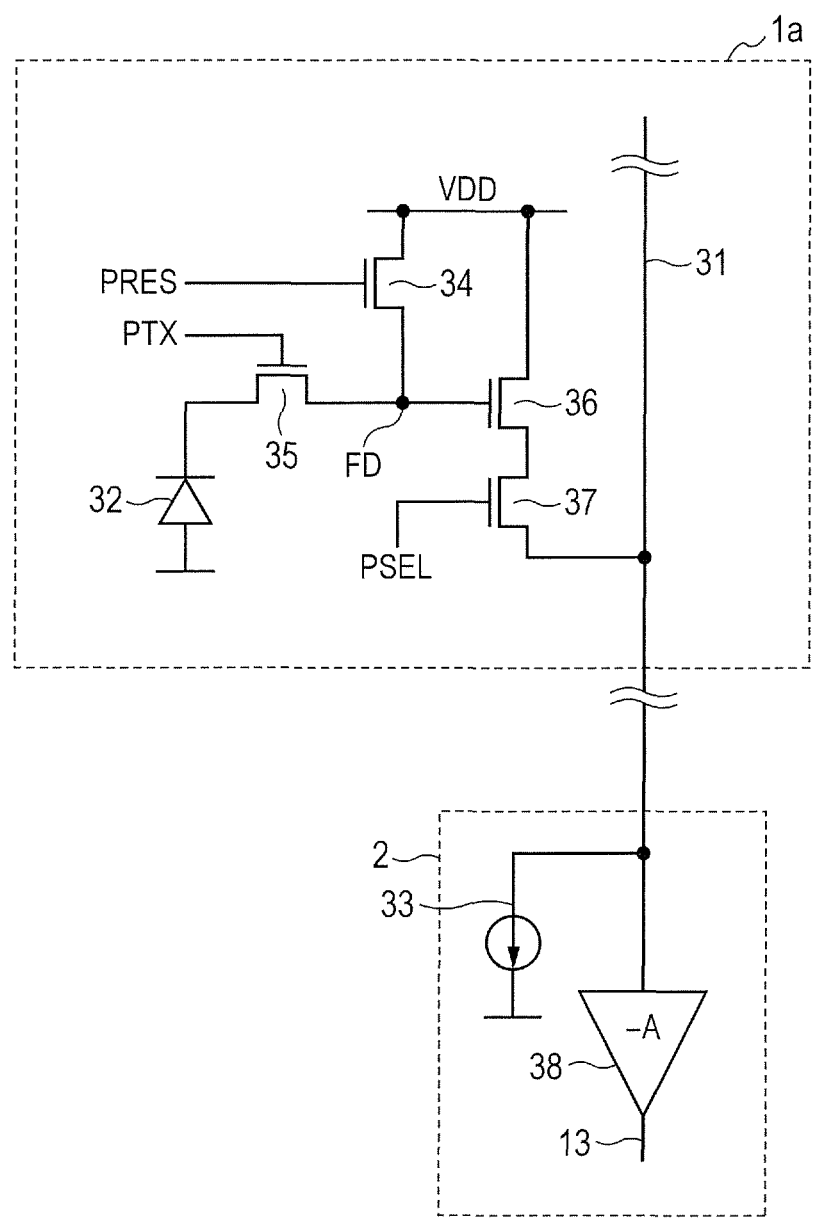
FIG. 3 is a view illustrating a circuit configuration of a pixel and a configuration of a readout circuit according to the first embodiment of the present invention.

FIG. 3 is a view illustrating a circuit configuration of the pixel, and a configuration of the readout circuit. A pixel 1a included in the pixel unit 1 includes a photoelectric conversion element 32, a reset transistor 34, a transfer transistor 35, a source follower transistor 36 and a pixel selecting transistor 37.

The photoelectric conversion element 32 is an element such as a photodiode which receives light, then generates an electromotive force by photoelectric conversion, and accumulates an electric charge therein.

A source terminal of the transfer transistor 35 is connected to the photoelectric conversion element 32. The drain terminal of the transfer transistor 35 is connected to a source terminal of the reset transistor and a gate terminal of the source follower transistor 36, and constitutes a floating diffusion FD. A pixel signal transfer signal PTX is input into a gate terminal of the transfer transistor 35. When the potential of the pixel signal transfer signal PTX is High, the transfer transistor 35 is turned ON, and the electric charge accumulated in the photoelectric conversion element 32 is transferred to the floating diffusion FD.

The drain terminal of the reset transistor 34 is connected to a power supply voltage VDD, and a pixel reset signal PRES is input into the gate terminal. When the potential of the pixel reset signal PRES is High, the reset transistor 34 is turned ON, and the potential of the floating diffusion FD is consistent with the power supply voltage VDD.

A drain terminal of the source follower transistor 36 is also connected to the power supply voltage VDD, and the potential of the source terminal is determined according to the potential of the floating diffusion FD which is connected to the gate terminal.

A drain terminal of the pixel selecting transistor 37 is connected to the source terminal of the source follower transistor 36, and the source terminal is connected to the output line 31 of the pixel signal. The pixel selecting transistor 37 is turned ON when the potential of the pixel selecting signal PSEL which is input into the gate terminal is High, and the potential of the source terminal of the source follower transistor 36 is output to the output line 31 of the pixel signal.

The readout circuit 2 includes a current source 33 that is connected to the output line 31 of the pixel signal, to which the signal sent from the pixel 1a is output, and a column amplifier 38 having a −A times gain. In a row corresponding to the readout row out of a plurality of pixel rows, the potential of the pixel selecting signal PSEL which is applied to the pixel selecting transistor 37 is High, and the pixel selecting transistor 37 is turned ON. At this time, a source follower circuit is formed of the source follower transistor 36 and the current source 33 in the readout circuit 2. In other words, a potential which is output to the output line 31 of the pixel signal equals the potential as that of the floating diffusion FD.

An operation of the circuit at the time when the signal is read out will be described below. When the potential of the pixel reset signal PRES is set at High and the reset transistor 34 is turned ON, the potential of the floating diffusion FD equals the potential as that of the power supply voltage VDD, and the circuit is reset. Next, the potential of the pixel reset signal PRES is set at Low, and the reset transistor 34 is turned OFF. After that, the potential of the pixel signal transfer signal PTX is set at High, and the transfer transistor 35 is turned ON. Then, the electric charge accumulated in the photoelectric conversion element 32 is transferred to the floating diffusion FD.

The potential which is output in the above described circuit operation will be described below. The source follower circuit is formed of the source follower transistor 36, and accordingly a voltage corresponding to the potential of the floating diffusion FD is output to the output line 31 of the pixel signal. Accordingly, the reset signal (power supply voltage VDD) of the pixel is input into the column amplifier 38 through the output line 31 of the pixel signal until the transfer transistor 35 is turned ON, and the pixel signal according to the light quantity is input into the column amplifier 38 after the transfer transistor 35 has been turned ON. Thereby, the reset signal and the pixel signal are multiplied by a factor of −A, and are output from the column amplifier 38.

Figure 4:
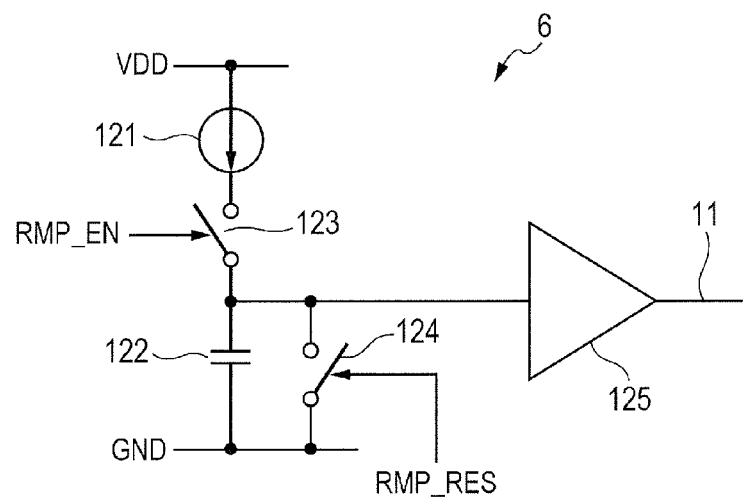
FIG. 4 is a view illustrating a circuit configuration of a reference signal generating unit according to the first embodiment of the present invention.

FIG. 4 is a view illustrating a circuit configuration of the reference signal generating unit 6 which generates a ramp signal that functions as a reference signal. The reference signal generating unit 6 includes a current source 121, a charge capacitor 122, a charge switch 123, a discharge switch 124 and an output buffer 125.

One end of the charge capacitor 122 is connected to one end of the charge switch 123, one end of the discharge switch 124 and the input terminal of the output buffer 125; and the other end is connected to the ground (GND). The other end of the charge switch 123 is connected to the current source 121. The other end of the discharge switch 124 is connected to the ground (GND). The output terminal of the output buffer 125 is connected to the RAMP wiring 11. The ON or OFF operation of the charge switch 123 is controlled by a charge switch control signal RMP_EN, and the ON or OFF operation of the discharge switch 124 is controlled by a discharge switch control signal RMP_RES. In the present description, both of the charge switch 123 and the discharge switch 124 shall be turned ON when the control signal is High.

Figure 5:
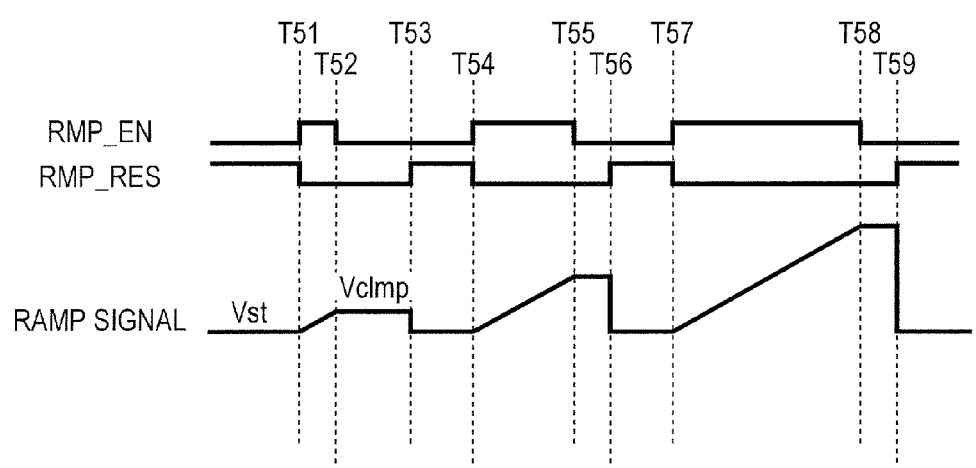
FIG. 5 is a timing chart illustrating an operation of the reference signal generating unit according to the first embodiment of the present invention.

FIG. 5 is a timing chart illustrating an operation of the reference signal generating unit. A flow in which the reference signal generating unit 6 generates the ramp signal will be described below with reference to FIG. 5. In a period before the time T51, the potential of the charge switch control signal RMP_EN is Low, and the potential of the discharge switch control signal RMP_RES is High. The discharge switch 124 is connected to the ground. Accordingly, the electric charge is discharged to the charge capacitor 122, and the potential of the input of the output buffer 125 is the ground potential. The output buffer 125 outputs a potential corresponding to the input of the ground potential to the RAMP wiring 11, as the ramp signal. The potential at this time shall be represented by Vst.

At the time T51, the potential of the discharge switch control signal RMP_RES becomes Low, the potential of the charge switch control signal RMP_EN becomes High, and charging from the current source 121 to the charge capacitor 122 is started. In a period from the time T51 to the time T52, the potential of the ramp signal increases as the electric charge is more accumulated in the charge capacitor 122.

At the time T52, the potential of the charge switch control signal RMP_EN becomes Low, and the charging is completed. A period from the time T51 to the time T52 is a period in which a voltage for offset cancellation is generated. At the time T52, the potential of the RAMP wiring 11 is consistent with a voltage Vclmp for offset cancellation. In a period from the time T52 to the time T53, the electric charge is not charged nor discharged in the charge capacitor 122, and accordingly the potential of the RAMP wiring 11 is held at Vclmp.

In a period from the time T53 to the time T54, the discharge switch control signal RMP_RES becomes High, and the electric charge which has been accumulated in the charge capacitor 122 is discharged. At this time, the potential of the RAMP wiring 11 becomes Vst.

At the time T54, the potential of the discharge switch control signal RMP_RES becomes Low, and the potential of the charge switch control signal RMP_EN becomes High. At the time T55, the potential of the charge switch control signal RMP_EN becomes Low. A period from the time T54 to the time T55 is a period in which the charge capacitor 122 is charged, and the ramp signal is generated of which the gradient is determined by the capacitance value of the charge capacitor 122 and the current value of the current source 121. The period from the time T54 to the time T55 is an A/D conversion period of the reset signal of the pixel 1a.

At the time T55, the potential of the charge switch control signal RMP_EN becomes Low, and then the RAMP wiring 11 holds the potential at the time right before the potential of the charge switch control signal RMP_EN becomes Low, because the electric charge is not charged nor discharged in the charge capacitor 122.

In a period from the time T56 to the time T57, the potential of the discharge switch control signal RMP_RES becomes High, the electric charge which has been accumulated in the charge capacitor 122 is discharged, and the potential of the RAMP wiring 11 becomes Vst. After that, at the time T57, the potential of the discharge switch control signal RMP_RES becomes Low, and the potential of the charge switch control signal RMP_EN becomes High. At the time T58, the potential of the charge switch control signal RMP_EN becomes Low. This period is a period in which the charge capacitor 122 is charged and the ramp signal is generated. This period is an A/D conversion period of the pixel signal. After that, at the time T59, the potential of the discharge switch control signal RMP_RES becomes Low, and the potential of the RAMP wiring 11 becomes Vst.

Figure 6:
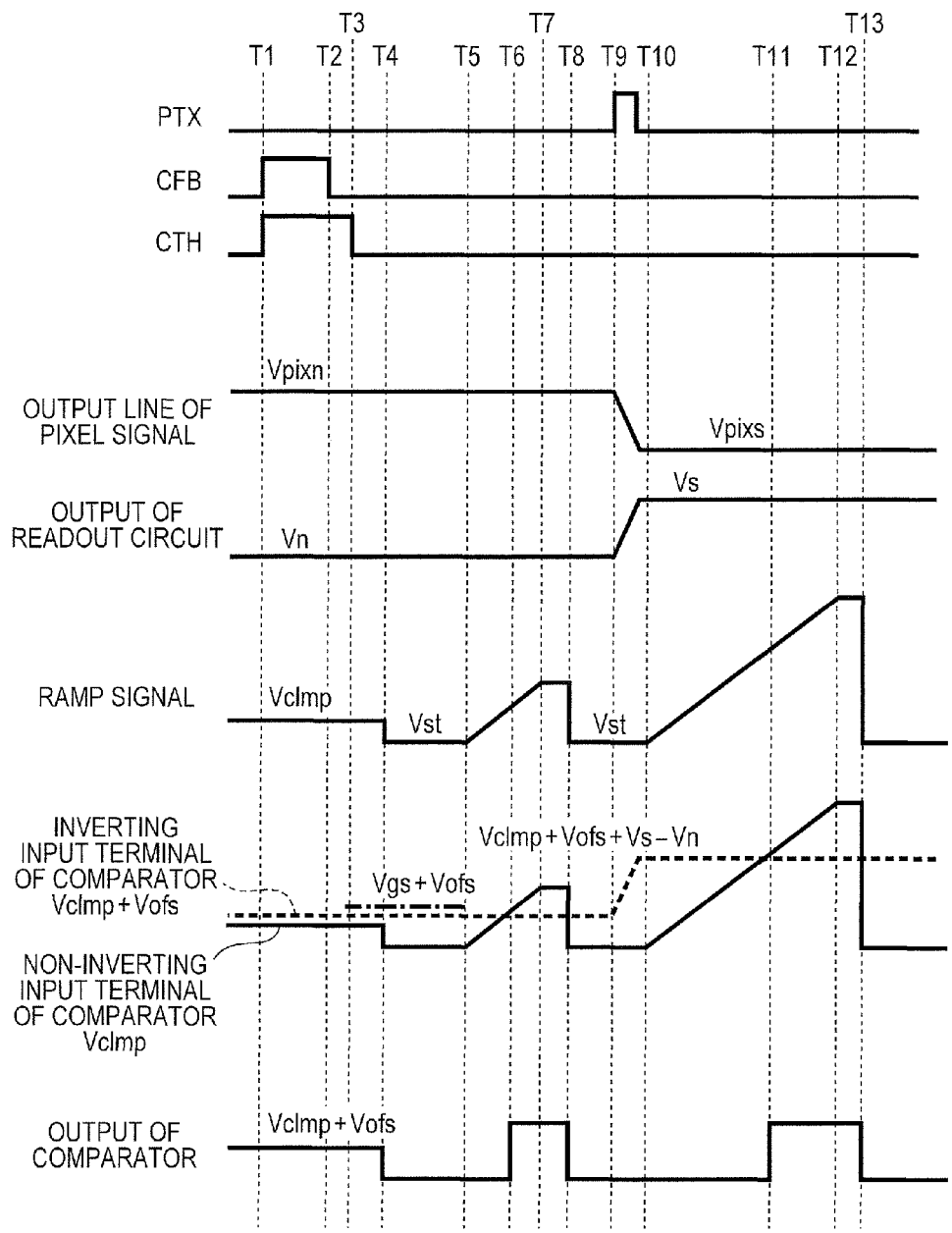
FIG. 6 is a timing chart illustrating an operation of the comparing unit according to the first embodiment of the present invention.

FIG. 6 is a timing chart illustrating an operation of the comparing unit 3 and a part of the pixel. The timing chart in FIG. 6 illustrates a relationship among voltages of each of the signals which are input and output from/to the comparing unit 3. Specifically, the timing chart illustrates the potentials and the timings of a pixel signal transfer signal PTX, a control signal CFB of the FB switch 22, a control signal CTH of the TH switch 23 and the ramp signal, as control signals to be input. In addition, the timing chart illustrates a relationship among the output voltage of the output line 31 of the pixel signal, the output voltage of the readout circuit 2, and the voltages of the inverting input terminal, the non-inverting input terminal and the output terminal of the comparator 21, as the relationship among the voltages of each of the corresponding wiring. Incidentally, the timing chart omits the illustration of the control signals PSEL and PRES in the pixel 1a, and the control signals RMP_EN and RMP_RES in the reference signal generating unit 6. In addition, the timing chart of FIG. 6 shows a period after the pixel 1a has been reset and when and after the ramp signal is outputting the voltage Vclmp.

In an initial state, specifically, before the time T1, the reset signal of the pixel 1a is output to the output line 31 of the pixel signal. The signal is multiplied by a factor of −A, in the column amplifier 38 in the readout circuit 2, and the multiplied signal is output from the readout circuit 2. At this time, the potential of the output line 31 of the pixel signal shall be represented by Vpixn, and the potential of the output line 13 of the readout circuit shall be represented by Vn.

At the time T1, the control signal CFB of the FB switch 22 and the control signal CTH of the TH switch 23 are shifted to High from Low. At this time, the output of the ramp signal is a potential Vclmp for offset cancellation. When the potential of the control signal CFB of the FB switch 22 is High, the FB switch 22 is turned ON. The inverting input terminal and the output terminal of the comparator 21 are short-circuited, and accordingly the comparing unit 3 assumes a structure of a voltage follower. Accordingly, the voltages of the output terminal and the inverting input terminal are consistent with a voltage of the non-inverting input terminal, specifically, are consistent with a voltage in which a voltage Vclmp and an offset voltage Vofs of the comparator itself are added. At this time, a potential difference across the first input capacitor 24 is Vclmp+Vofs−Vn which is a potential difference between the voltage of the inverting input terminal and the reset signal voltage Vn.

After that, the potential of the control signal CFB of the FB switch 22 is shifted at the time T2, and the potential of the signal of the control signal CTH of the TH switch 23 is shifted at the time T3, in this order, to Low from High. When the CFB becomes Low, the FB switch 22 is turned OFF, and accordingly Vclmp+Vofs−Vn is held which is the potential difference across the first input capacitor 24. In addition, when the potential of the control signal CTH of the TH switch 23 becomes Low, the TH switch 23 is turned OFF, and accordingly a potential difference across the second input capacitor 25 is held at 0.

After that, at the time T4, the potential of the ramp signal falls to Vst. At the time T5, the A/D conversion of the reset signal of the pixel 1a is started.

At the time T6, when the potential of the signal which is input into the non-inverting input terminal of the comparator 21 exceeds the voltage Vclmp+Vofs held at the inverting input terminal, the potential of the output of the comparator is shifted to High from Low. The count value at this time is stored in the storage unit 4 as the digital data of the reset signal, and thereby the input signal is subjected to the A/D conversion. After that, at the time T7, the A/D conversion period of the reset signal ends. At the time T8, the potential of the ramp signal falls to Vst again.

After that, at the time T9, the potential of the pixel signal transfer signal PTX is shifted to High from Low, and then the pixel signal is output to the output line 31 of the pixel signal. The potential of the output line 31 of the pixel signal at this time shall be represented by Vpixs. The potential of the output line 31 of the pixel signal is multiplied by the factor of −A, in the column amplifier 38 of the readout circuit 2. Then, a potential Vs corresponding to the pixel signal is output to the output line 13 of the readout circuit from the readout circuit 2. Here, the potential Vpixs becomes smaller as the quantity of light incident on the pixel 1a becomes larger. When the light is not incident on the pixel 1a, a relationship of Vpixs=Vpixn holds. On the other hand, the output of the readout circuit 2 is amplified by the column amplifier 38 which is the inverting amplifier having the −A times gain, and the positive and negative potentials are inverted. Accordingly, the potential Vs becomes high according to the light quantity. In addition, when the light is not incident on the pixel 1a, a relationship of Vs=Vn holds, and the minimal value of the potential which is output from the readout circuit 2 becomes Vn. Accordingly, when the pixel signal is output to the output line 31 of the pixel signal, the potential which is output to the output line 13 of the readout circuit increases by a value of Vs−Vn, and accordingly the potential of the inverting input terminal of the comparator 21 is Vclmp+Vofs+Vs−Vn.

After that, at the time T10, the A/D conversion of the pixel signal is started. At the time T11, when the potential of the non-inverting input terminal exceeds Vclmp+Vofs+Vs−Vn, the potential of the output of the comparator is shifted to High from Low, and the digital data of the pixel signal is stored in the storage unit 4. At the time T12, the A/D conversion of the pixel signal ends. At the time T13, the potential of the ramp signal is returned to Vst again. At this time, the signal processing circuit 8 acquires a difference of the digital data between the pixel signal and the reset signal which are stored in the storage unit 4, and outputs the difference. Thus, the A/D conversion of the pixel 1a ends.

Next, the lower limit in the input voltage range of the comparator 21 during the operation of the above described comparing unit 3 will be described. As described above, the lower limit value of the potential of the signal which is output from the readout circuit 2 and is input into the comparing unit 3 is a potential Vn which corresponds to the output of the readout circuit in the case where the potential of the reset signal of the pixel 1a is Vpixn. Specifically, the potential which is input into the inverting input terminal of the comparator 21 during the A/D conversion period of this reset signal is the lower limit of the potential with which the comparator 21 should compare, and the potential serves as the lower limit in the input voltage range of the comparator 21. Because the offset is canceled in a period in which Vn is output from the readout circuit, the potential of the inverting input terminal at the time when the offset is canceled is Vclmp+Vofs as has been described above. When the analog data of the reset signal of the pixel 1a is converted into the digital data, the potential of the output of the readout circuit 2 does not change from the potential at the time when the offset has been canceled and holds Vn, and accordingly the potential of the inverting input terminal of the comparator 21 holds Vclmp+Vofs. Because a relationship of Vs Vn holds, the potential of the inverting input terminal of the comparator 21 is Vclmp+Vofs or larger during the A/D conversion period of the pixel signal. Therefore, this value Vclmp+Vofs is the lower limit value of the input voltage with which the comparator 21 should compare. Suppose that Vofs is small and can be neglected, the lower limit value in the input voltage range of the comparator 21 is Vclmp. A dashed dotted line shown in the inverting input terminal of the timing chart is the lower limit value Vgs+Vofs of the input voltage in a conventional example which will be described later. Accordingly, in the present exemplary embodiment, if Vclmp is set to be smaller than Vgs, the input voltage range can be set to be larger than that in the conventional example, by a potential difference between Vgs and Vclmp.

Figure 7:
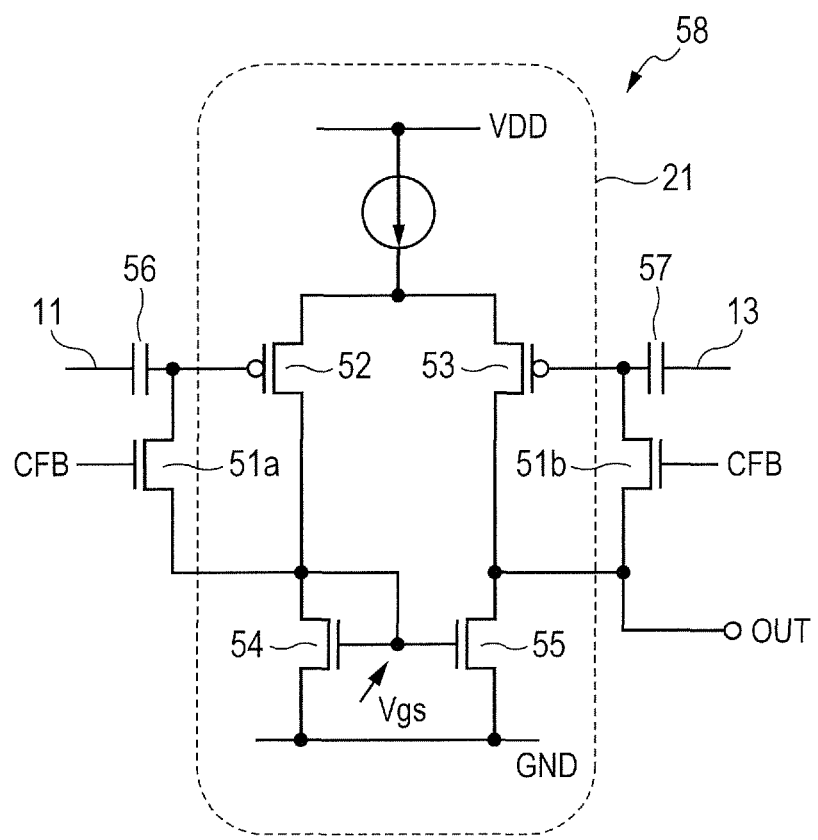
FIG. 7 is a view illustrating a circuit configuration of the comparing unit for describing a comparative example.

Next, the offset cancellation in the comparative example will be described which is compared to the above described first embodiment of the present invention. FIG. 7 is a view illustrating a circuit configuration of a comparing unit in a comparative example in which the offset cancellation is performed. A comparing unit 58 includes a comparator 21, diode switches 51a and 51b, and input capacitors 56 and 57. The comparator 21 includes transistors 52 and 53 which are P-channel type MOSFETs, and transistors 54 and 55 which are N-channel type MOSFETs. The comparator 21 is formed of a differential amplifier circuit which uses the current mirror circuit. This differential amplifier circuit is the current mirror circuit which has the P-channel type transistors 52 and 53 arranged in the differential input side, and has the Nch-channel type transistors 54 and 55 connected to the drain terminals of the transistors 52 and 53 that are differential input transistors. Specifically, a current source 140 which applies an electric current to the circuit is connected to a commonized source terminal of the transistors 52 and 53. The drain terminals of the transistors 52 and 53 are connected to the drain terminals of the transistors 54 and 55, respectively. The gate terminal of one transistor 52 of the differential input transistors is a non-inverting input terminal of the comparator 21, and the gate terminal of the other transistor 53 thereof is an inverting input terminal of the comparator 21. The non-inverting input terminal of the comparator 21 is connected to the RAMP wiring 11 through an input capacitor 56, and the inverting input terminal is connected to the output line 13 of the readout circuit through an input capacitor 57. A diode switch 51a is connected between the gate terminal and the drain terminal of the transistor 52, and a diode switch 51b is connected between the gate terminal and the drain terminal of the transistor 53. The connecting point in between the drain terminal of the transistor 53 and the drain terminal of the transistor 55 constitutes an output terminal OUT of the comparing unit 58, and is connected to the storage unit 4. The source terminal of the transistors 54 and 55 is connected to the ground (GND). In addition, the gate terminal and the drain terminal of the transistor 54 are connected to each other, and the transistor 54 assumes a diode-connected structure.

Figure 8:
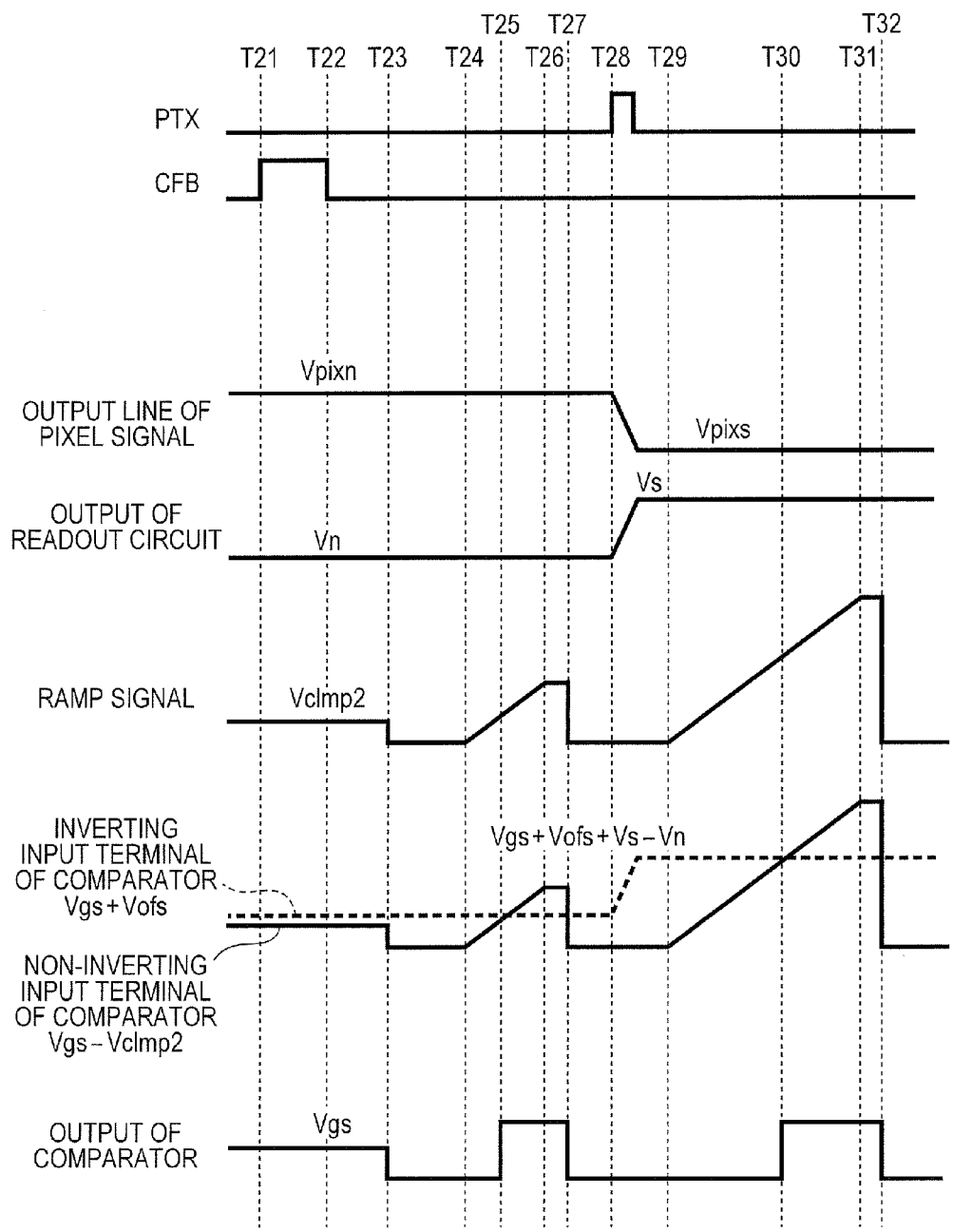
FIG. 8 is a timing chart illustrating an operation of the comparing unit in the comparative example.

FIG. 8 is a timing chart illustrating an operation of the comparing unit in the comparative example. The operation of the comparing unit 58 according to the comparative example is similar to the above description, except the time when the offset voltage is charged in the capacitor, and accordingly the description will be omitted. At the time T21, when the voltage of the control signal CFB of the diode switches 51a and 51b become High, the offset cancellation operation is started. At this time, the diode switches 51a and 51b are turned ON, and the gate terminal and the drain terminal of each of the transistors 52 and 53 are connected to each other to form diode connection.

At this time, the potential of the non-inverting input terminal, specifically, the potential of the gate terminal of the transistor 52 coincides with the potential difference Vgs between the gate and the source of the transistor 54. In addition, the potential of the inverting input terminal is Vgs+Vofs in which an offset voltage Vofs occurring due to the variation of the transistors 53 and 55 with respect to the transistors 52 and 54 is also added to Vgs. After that, at the time T22, the voltage of the control signal CFB of the diode switches 51a and 51b becomes Low, and the offset cancellation period ends. When the potential of the ramp signal in the period from T21 to T22 is represented by Vclmp2, the potential difference of Vgs−Vclmp2 is held in the input capacitor 56 in the non-inverting input terminal side, and the potential difference of Vgs+Vofs−Vn is held in the input capacitor 57 in the inverting input terminal side. Hereafter, the operations of the A/D conversion of the reset signal of the pixel 1a and the A/D conversion of the pixel signal are similar to the above description, and accordingly the description will be omitted. From the similar reason to the above description, the potential of the inverting input terminal serves as the lower limit value in the input voltage range of the comparator 21, in the A/D conversion period of the reset signal of the pixel 1a. Suppose that the offset voltage Vofs of the comparator is small and can be neglected. Then, the lower limit value of the input voltage of the inverting input terminal of the comparator 21 is Vgs in the comparative example. This Vgs is determined by a semiconductor manufacturing condition and the amount of a drain current flowing in the transistor 54.

As described above, in the comparative example, the lower limit value of the input voltage is determined by the Vgs of the current mirror transistor. On the other hand, in the present invention, the lower limit value of the input voltage is determined by Vclmp. Therefore, if the voltage Vclmp for the offset cancellation of the ramp signal is set to be smaller than the Vgs of a current mirror transistor, the lower limit value in the input voltage range of the comparator 21 can be set to be small compared to that in the comparative example. Therefore, the input voltage range of the comparator is enlarged.

Incidentally, in the first embodiment, a configuration has been described in which the input capacitors 24 and 25 are arranged so as to be connected to the respective two input terminals of the comparator 21 in serial, but the present invention is not limited to the configuration. For instance, the second input capacitor 25 may be omitted. In the case, the RAMP wiring 11 and the non-inverting input terminal of the comparator 21 are directly connected to each other. In addition, the circuit configuration of the pixel 1a and the circuit configuration of the readout circuit 2 have been described, but the present invention is not limited to those circuit configurations. In addition, the described circuit configuration of the reference signal generating unit 6 is one example, and the configuration is not limited to this. These circuits can be suitably changed so that a similar operation is obtained. For instance, the output buffer 125 may be omitted, and at the same time, the charge capacitor 122 may be directly connected to the RAMP wiring 12. The differential amplifier circuit illustrated in FIG. 2B has been illustrated and described as the circuit configuration of the comparator 21, but the present invention is not limited to the circuit.

Figure 9:
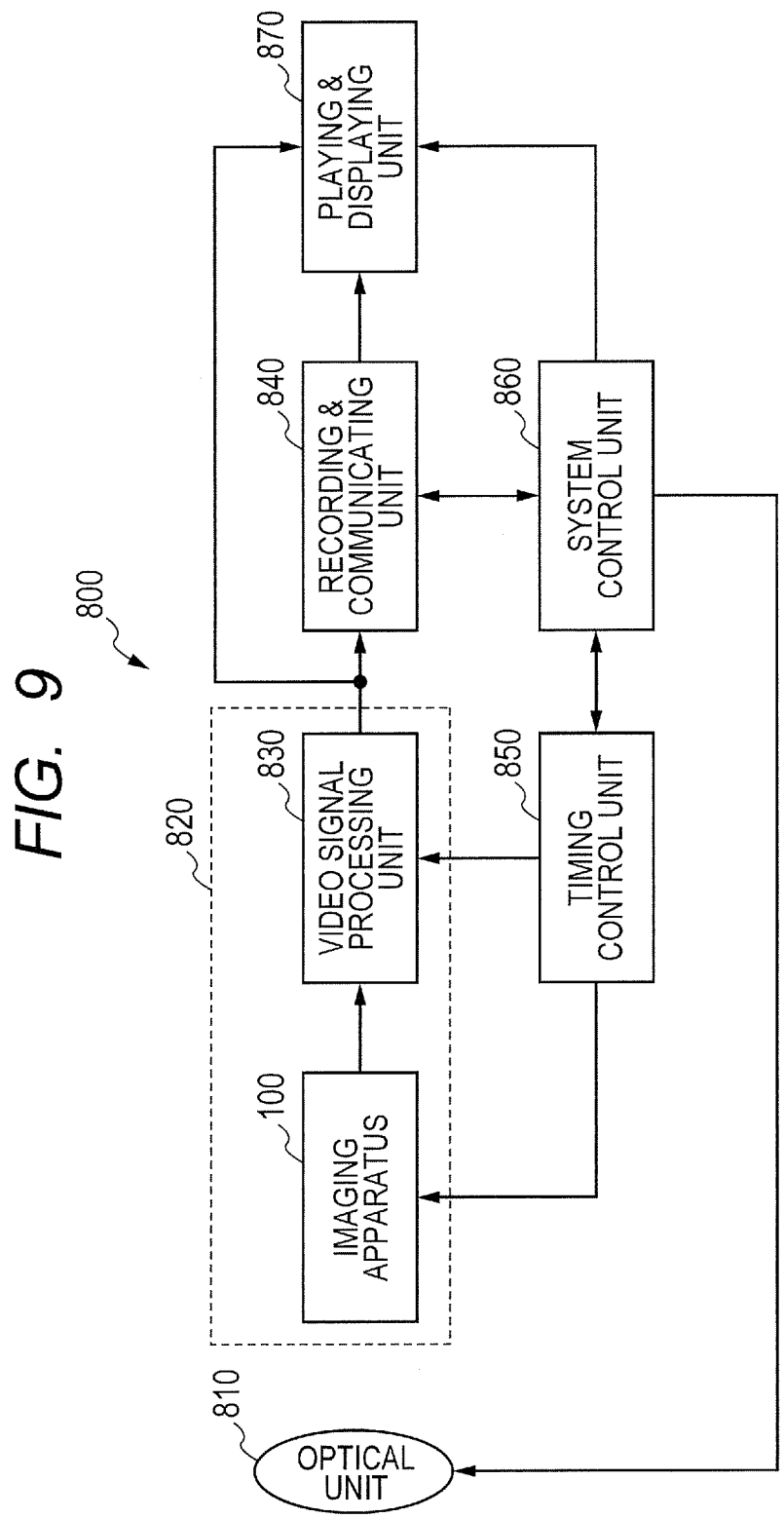
FIG. 9 is a view illustrating a configuration of an imaging system which uses the imaging apparatus according to the first embodiment of the present invention.

FIG. 9 is a view illustrating a configuration of an imaging system which uses the imaging apparatus according to the first embodiment of the present invention. An imaging system 800 includes an optical unit 810, an imaging apparatus 820, a recording & communicating unit 840, a timing control unit 850, a system control unit 860 and a playing & displaying unit 870. The imaging apparatus 820 includes the imaging apparatus 100, and a video signal processing unit 830. The above described imaging apparatus 100 is used for the imaging apparatus 100.

The optical unit 810 composed of an optical system such as a lens focuses an image of light emitted from an object onto a pixel unit 1 of the imaging apparatus 100, in which a plurality of pixels is two-dimensionally arrayed, to form an image of the object on the pixel unit 1. The imaging apparatus 100 outputs signals according to the light imaged on the pixel unit 1, on the timing based on the signal output from the timing control unit 850. The signals output from the imaging apparatus 100 are input into the video signal processing unit 830. The video signal processing unit 830 performs signal processing such as the conversion of the input signal into image data, according to a specified method by a program. The signals resulting from the processing in the video signal processing unit 830 are sent to the recording & communicating unit 840 as image data. The recording & communicating unit 840 sends signals for forming an image to the playing & displaying unit 870, and makes the playing & displaying unit 870 play & display a moving image or a still image. The recording & communicating unit 840 also communicates with the system control unit 860 by receiving the signals sent from the video signal processing unit 830, and also performs an operation of recording the signals for forming an image on an unillustrated recording medium.

The system control unit 860 is a unit for collectively controlling an operation of the imaging system, and controls a drive of each of the optical unit 810, the timing control unit 850, the recording & communicating unit 840, and the playing & displaying unit 870. In addition, the system control unit 860 is provided, for instance, with an unillustrated storage apparatus that is a recording medium, and records a program which is necessary for controlling the operation of the imaging system, in the storage apparatus. The system control unit 860 also supplies, for instance, a signal which switches driving modes according to an operation of a user, into the imaging system. Specifically, the system control unit 860 supplies signals for switching, such as a change of a line to be read out or a line to be reset, a change of an angle of view, which accompanies an operation of an electronic zoom, and a shift of an angle of view, which accompanies electronic anti-vibration. The timing control unit 850 controls the driving timings for the imaging apparatus 100 and the video signal processing unit 830 based on the control by the system control unit 860.

The comparing unit 3 which is provided in the imaging apparatus 100 according to the present embodiment has an enlarged input voltage range while decreasing the offset voltage. Specifically, the range of the voltage is enlarged which can be input at the time of the A/D conversion. Accordingly, the imaging system 800 can be achieved which can take an image with high precision by mounting the imaging apparatus 100 according to the present embodiment thereon.

(Second Embodiment)

Figure 10:
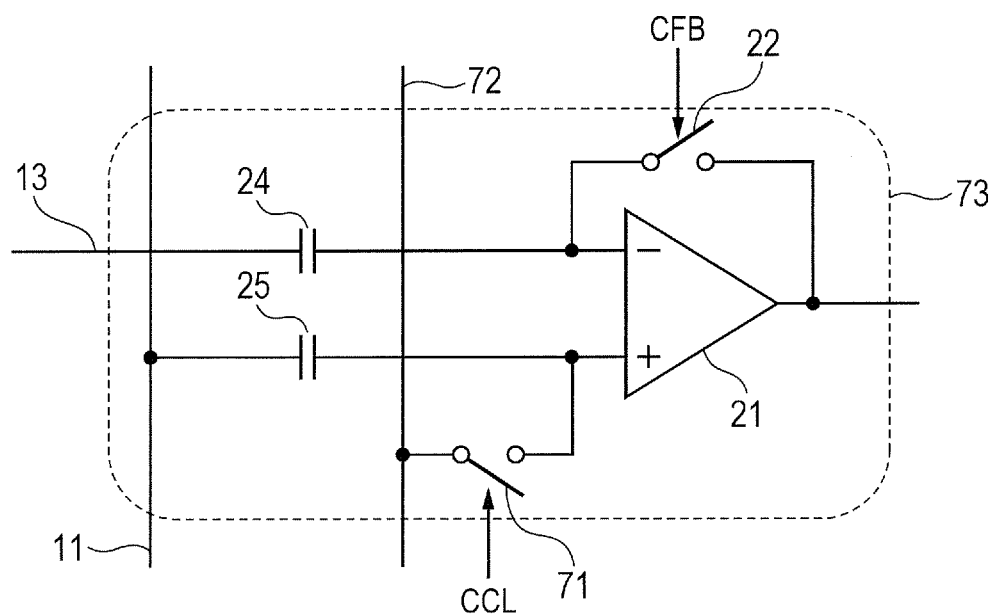
FIG. 10 is a view illustrating a configuration of a comparing unit according to a second embodiment of the present invention.

A comparator according to a second embodiment of the present invention will be described below. Incidentally, elements and wirings having similar functions as those in the first embodiment are designated by the same reference numerals, and the description will be occasionally omitted. FIG. 10 illustrates a circuit configuration of a comparing unit 73 which uses a comparator 21 according to the second embodiment of the present invention. The comparing unit 73 includes the comparator 21, an FB switch 22, a first input capacitor 24, a second input capacitor 25 and a potential supply switch 71. A fixed potential supply line 72 is connected to a non-inverting input terminal of the comparator 21 through the potential supply switch 71. Furthermore, to the non-inverting input terminal of the comparator 21, one end of the second input capacitor 25 is connected in parallel with the fixed potential supply line 72. The RAMP wiring 11 is connected to the other end of the second input capacitor 25. The connection of an inverting input terminal and the output terminal of the comparator 21 is similar to that in the first embodiment. One end of the FB switch 22 is connected to the output terminal of the comparator 21, and the other end thereof is connected to the inverting input terminal of the comparator 21 and one end of the first input capacitor 24. The output line 13 of the readout circuit is connected to the other end of the first input capacitor 24. Incidentally, circuits other than the comparing unit 73, such as the readout circuit 2, are similar to those in the first embodiment.

Figure 11:
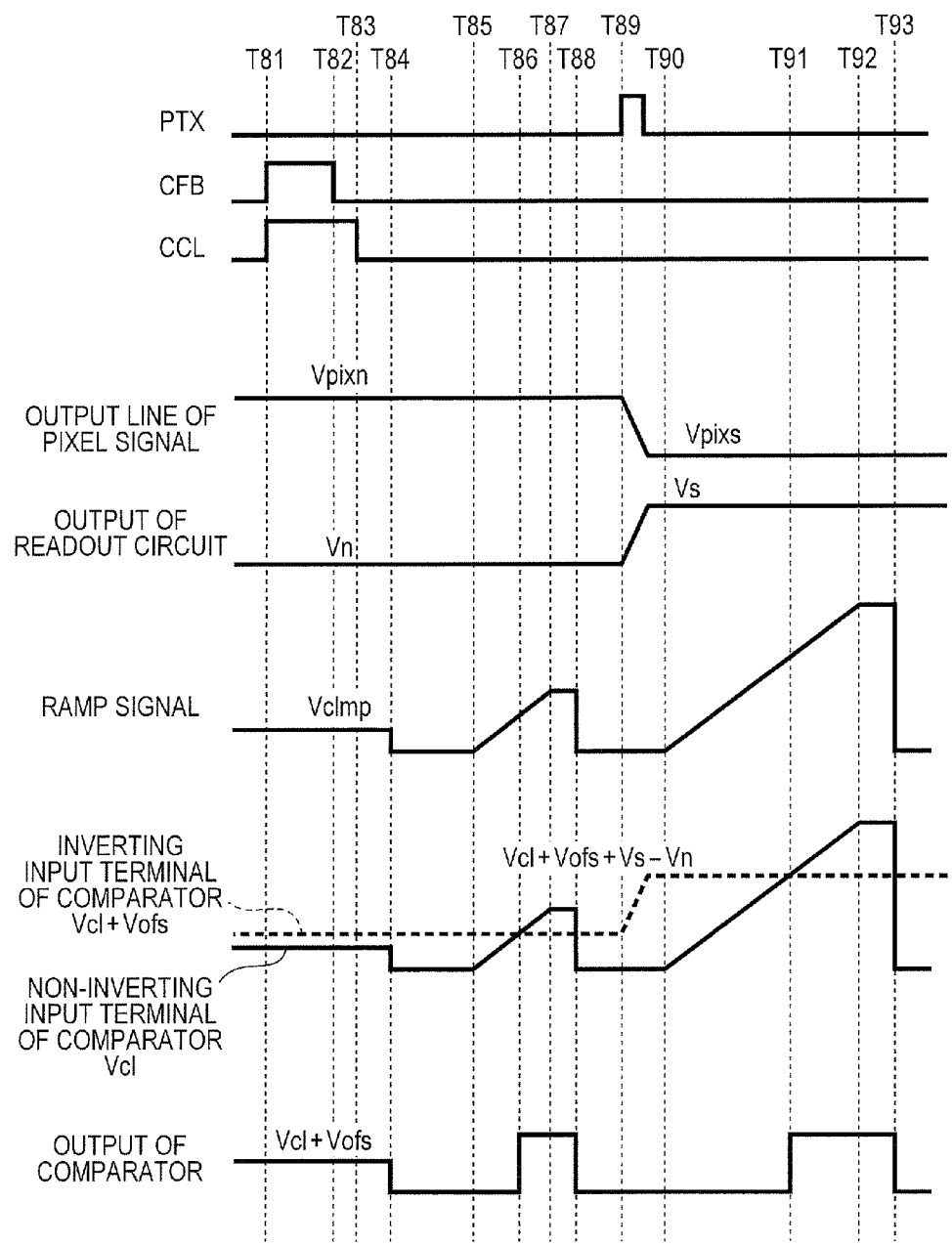
FIG. 11 is a timing chart illustrating an operation of the comparing unit according to the second exemplary embodiment of the present invention.

FIG. 11 illustrates a timing chart for describing an operation of the present embodiment. In the description of the timing chart, the above described portion will be omitted. At the time T81, both of the potentials becomes High, which are the potential of the control signal CFB of the FB switch 22 for controlling an ON or OFF operation of the FB switch 22, and the potential of the control signal CCL of the potential supply switch 71 for controlling an ON or OFF operation of the potential supply switch 71. At this time, the signal which is output from the pixel 1a is a reset signal, similarly to the case in the first embodiment. In addition, the comparator 21 assumes a structure of a voltage follower.

When the potential of the fixed potential supply line 72 is represented by Vcl, the potential of the non-inverting input terminal of the comparator 21 is Vcl, and the potential of the inverting input terminal is Vcl+Vofs in which the offset voltage Vofs of the comparator is added to Vcl. At this time, a potential difference across the first input capacitor 24 is Vcl+Vofs−Vn which is a potential difference between the potential Vcl+Vofs of the inverting input terminal and the potential Vn of the output line 13 of the readout circuit. In addition, a potential difference across the second input capacitor 25 is Vcl−Vclmp which is a potential difference between the potential Vcl of the fixed potential supply line 72 and the potential Vclmp of the ramp signal.

After that, at the time T82, the potential of the control signal CFB of the FB switch 22 becomes Low. At the time T83, the potential of the control signal CCL of the potential supply switch 71 becomes Low. At this time, the potential difference held in the first input capacitor 24 is Vcl+Vofs−Vn, and the potential difference held in the second input capacitor 25 is Vcl−Vclmp. The subsequent operations have been described above, and accordingly the description will be omitted.

Accordingly, when the reset signal of the pixel 1a is converted from analog to digital, the potential of the inverting input terminal of the comparator 21 is Vcl+Vofs. Therefore, suppose that the offset voltage Vofs of the comparator is small and can be neglected, the lower limit of the voltage to be input into the comparator 21 is Vcl. Therefore, when the potential Vcl to be supplied from the fixed potential supply line 72 is set to be smaller than the voltage Vgs between the gate and the source in the above described comparative example, the input voltage range of the comparing unit 73 is enlarged.

In the first embodiment, the potential is supplied from the RAMP wiring 11, and accordingly there is such a limitation that only a potential within a range in which the RAMP wiring 11 can output the ramp signal therethrough can be supplied. On the other hand, in the second embodiment, the potential is supplied from the fixed potential supply line 72 which is different from the RAMP wiring 11. Accordingly, the advantage of the second embodiment is a point that the fixed potential to be supplied to the non-inverting input terminal can be independently set without being restricted by the range in which the RAMP wiring 11 can output the signal therethrough.

(Third Embodiment)

Figure 12:
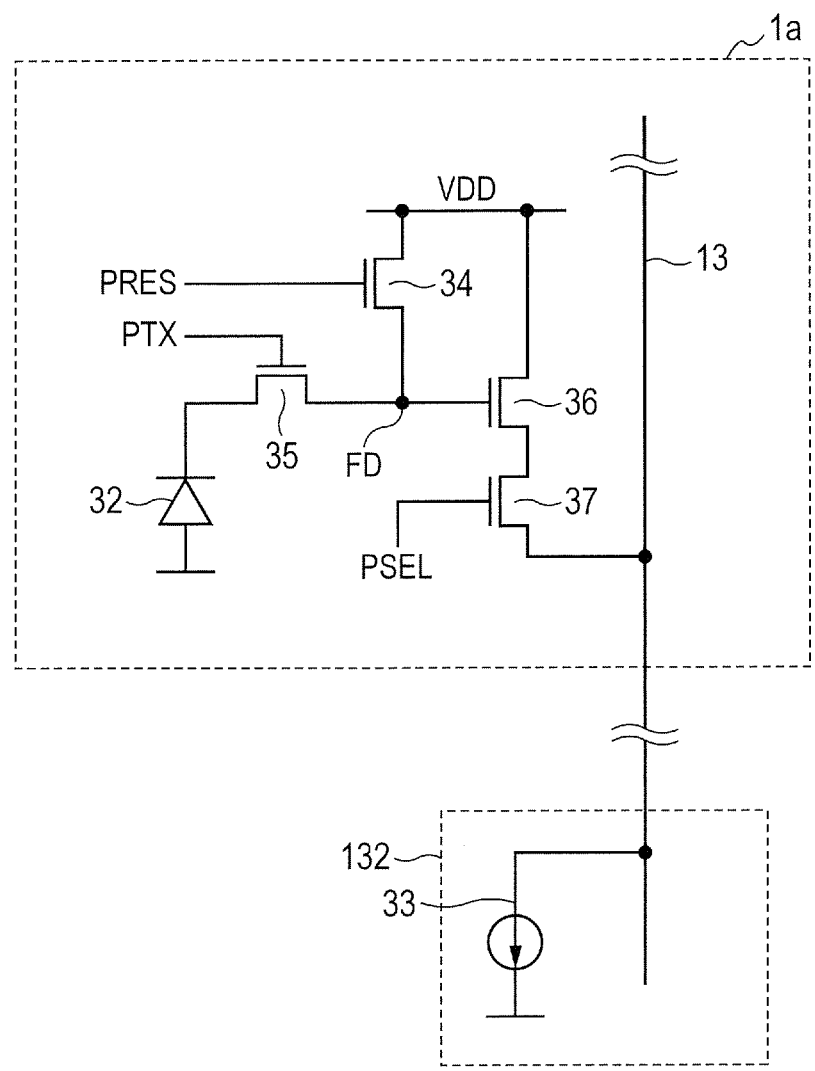
FIG. 12 is another view illustrating a circuit configuration of a pixel and a configuration of a readout circuit.

A third embodiment of the present invention will be described below. FIG. 12 is a view illustrating a circuit configuration of a pixel 1a and a circuit configuration of a readout circuit 132 according to the third embodiment of the present invention. A point in which the third embodiment is different from the first and second embodiments is that the column amplifier of the readout circuit is omitted. Therefore, the previous output line 31 of the pixel signal is connected to the output line 13 of the readout circuit, and the potential of the output line 13 of the readout circuit is output intact as the potential of the output line 31 of the pixel signal. In the subsequent description, both of the wirings shall be integrally referred to as the output line 13 of the readout circuit. The other descriptions are similar to the above description, and accordingly the description will be omitted.

Figure 13:
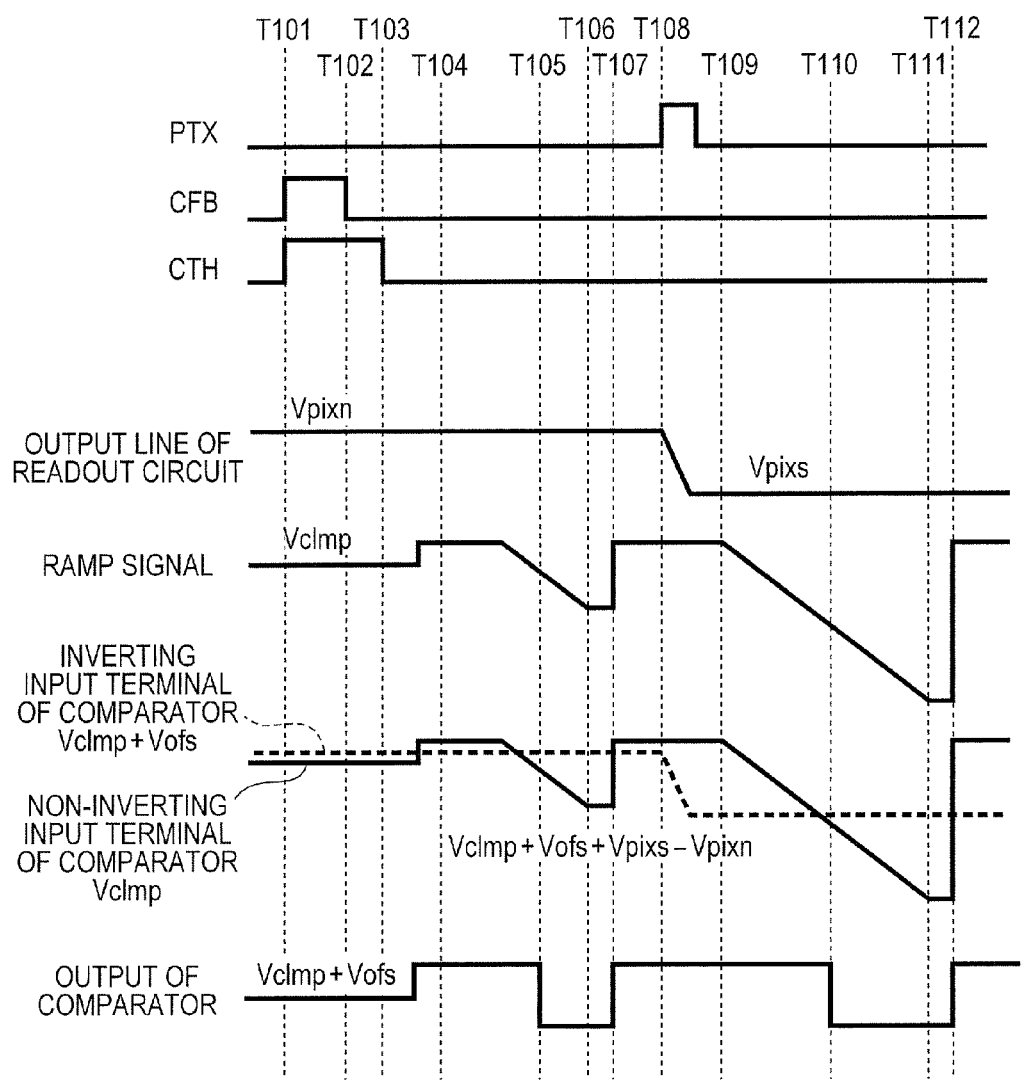
FIG. 13 is a timing chart illustrating an operation of a comparing unit according to a third exemplary embodiment of the present invention.

An operation of the comparing unit 3 according to the present embodiment will be described below. FIG. 13 is a timing chart for describing an operation of the present embodiment. In the present embodiment, there is no column amplifier having a −A times gain, and accordingly the output from the source follower of the pixel 1a is directly input into the comparing unit 3. Therefore, the potential of the ramp signal shows such a form that the ramp signal described in the exemplary embodiments 1 and 2 is vertically inverted, specifically, that the potential becomes smaller according to the elapse of the time. Along with the inversion, the output of the comparator 21 also shows such a waveform that the above described waveform is inverted, as is illustrated in FIG. 13. Incidentally, the potential of the ramp signal can be inverted in this way, for instance, by a structure in which the output buffer 125 of the reference signal generating unit 6 is formed of a inverting amplifier circuit.

An operation of the comparing unit 3 will be described below. At the time T101, the potentials of the control signal CFB of the FB switch 22 and the control signal CTH of the TH switch 23 become High, and then the comparator 21 assumes a structure of a voltage follower. At this time, when the potential of the RAMP wiring 11 is represented by Vclmp, the potential of the non-inverting input terminal of the comparator 21 is Vclmp, and the potential of the inverting input terminal is Vclmp+Vofs in which the offset voltage Vofs of the comparator 21 is added to Vclmp. At the time T102, the potentials of the control signal CFB of the FB switch 22 and the control signal CTH of the TH switch 23 become Low. Then, a potential difference Vclmp+Vofs−Vpixn is held across the first input capacitor 24, and a potential difference 0 is held across the second input capacitor 25. The subsequent operations of the A/D conversion of the reset signal and the A/D conversion of the pixel signal have been described above, and accordingly will be omitted.

As for the upper limit of the potential to be input into the comparator 21 in the present exemplary embodiment, suppose that Vofs is small and can be neglected. Then, as has been described above, the upper limit value of the input voltage range of the comparator 21 is Vclmp. On the other hand, in the comparator formed of a differential amplifier circuit which uses a P-channel type transistor for the differential input illustrated in FIG. 7, the upper limit of the input voltage is determined by Vgs which is a voltage between the gate and the source of the current mirror circuit that is formed of the N-channel type transistor. Accordingly, if Vclmp is set to be larger than Vgs, the input voltage range can be enlarged.

As has been described above, in the third embodiment, the column amplifier having a negative amplification factor is omitted, and accordingly a voltage to be input to the comparing unit is vertically inverted with respect to the case of the first embodiment. Accordingly, as in the potential of the output line of the readout circuit in FIG. 13, when the incident light quantity into the pixel 1a is large, the voltage to be input into the comparing unit becomes low, and when the incident light quantity is small, the voltage to be input into the comparing unit becomes high. This relationship is reverse to the case of the first embodiment. In the first embodiment, the transistor arranged in the input side of the comparing unit 3 has employed a P-channel type transistor which has a wide input range in the ground side. However, in a configuration in which the column amplifier having the negative amplification factor is omitted as in the third embodiment, the circuit configuration can be changed so that the N-channel type transistor having a wide input range in a high-voltage side is used in the input side.

Figure 14:
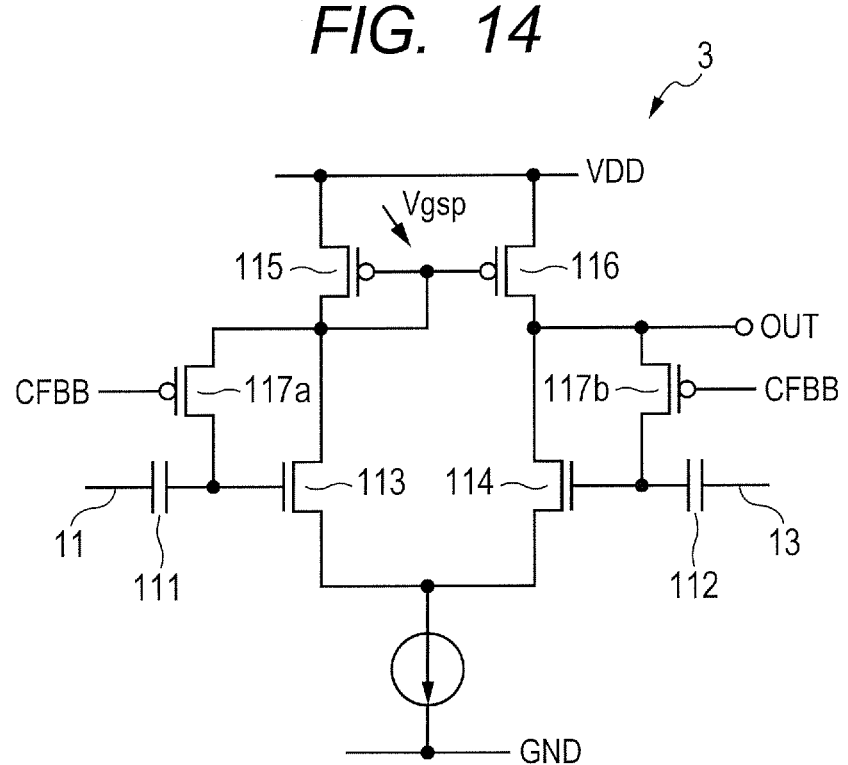
FIG. 14 is a view illustrating another circuit configuration of the comparing unit for describing the comparative example.

For the above described reason, the comparing unit to be compared with that in the third embodiment has a configuration different from the comparing unit which has been compared in the first embodiment and is illustrated in FIG. 7. FIG. 14 is a view illustrating another circuit configuration of a comparing unit in a comparative example, which is compared with the comparing unit 3 in the third embodiment of the present invention. A point different from the comparing unit illustrated in FIG. 7 will be described below. N-channel type transistors 113 and 114 are arranged in the differential input side. The drain terminals of P-channel type transistors 115 and 116 are connected to the drain terminals of the transistors 113 and 114, respectively. In other words, the arrangement of the N-channel type transistor and the P-channel type transistor is reverse to the arrangement of that in the comparing unit in FIG. 7. Correspondingly, the power supply potential VDD is connected to the source terminals of the P-channel type transistors 115 and 116, and the source terminals of the N-channel type transistors 113 and 114 are connected to the ground. In addition, a diode switch 117a is connected between the gate terminal and the drain terminal of the transistor 113, and a diode switch 117b is connected between the gate terminal and the drain terminal of the transistor 114. The diode switches 117a and 117b are turned ON when the potential of the control signal CFBB is Low.

The operation of the comparing unit 3 is similar to that in the comparing unit illustrated in FIG. 7, and accordingly the details will be omitted, but a point that the input voltage ranges are different from each other will be described below. When the offset is canceled, the potential of the control signal CFBB becomes Low, and the differential input transistors 113 and 114 assume a structure of diode connection. At this time, the potential of the gate terminal of the transistor 113 is VDD−Vgsp, and the potential of the gate terminal of the transistor 114 is VDD−Vgsp+Vofs in which the offset voltage Vofs is added to VDD−Vgsp. Incidentally, Vgsp is a voltage between the gate and the source of the P-channel type transistor which constitutes the current mirror circuit. When Vofs is small and can be neglected, in this configuration, the upper limit of the input voltage is VDD−Vgsp. Therefore, when Vclmp is set to be larger than VDD−Vgsp, the input voltage range is enlarged.

Incidentally, in the third embodiment, the operation of the comparing unit 3 has been described on the assumption that the operation of the comparing unit 3 is similar to that of the comparing unit in the first embodiment, but the comparing unit 3 described in the second embodiment can also be applied. In this case, if the potential Vcl which is supplied from the fixed potential supply line 72 is set to be larger than Vgs or VDD−Vgsp, the present embodiment can be configured so that a similar effect is shown.

In the third embodiment, the column amplifier 38 is omitted, and accordingly it can be avoided that a noise generated in the column amplifier 38 is overlapped on the pixel signal. In addition, the number of the elements is reduced. Accordingly, an efficiency percentage is enhanced, and the area of the imaging apparatus can be reduced. Accordingly, it is advantageous in terms of both economical efficiency and reduction in the size.

Incidentally, in the third embodiment, the output line 13 of the readout circuit is input directly into the comparing unit 3, but an inputting method in the present invention is not limited to the direct inputting method. For instance, a non-inverting amplifier may be arranged between the output line 13 of the readout circuit and the comparing unit 3. By doing so, the output signal potential can be amplified as needed, and the precision can be enhanced.

(Other Embodiments)

The imaging apparatus 100 described in the first to third embodiments is not limited to the above described embodiments, and can be modified in various ways. One example thereof will be described below.

It is also acceptable to provide a path through which an output line of a pixel signal bypasses a column amplifier 38 and is connected to the comparing unit 3 in the configuration illustrated in FIG. 3 so that the imaging apparatus can switch between a path through which a pixel signal is given to the comparing unit 3 through the column amplifier 38 and a path through which the pixel signal is directly given to the comparing unit 3. The bypass path which is switched from another path can be achieved by adding a bypass circuit which uses a diode switch in parallel, and turning ON or turning OFF the diode switch by a control signal. Thereby, the imaging apparatus can avoid a phenomenon that a noise generated in the column amplifier 38 is superimposed on the pixel signal, by directly giving the pixel signal to the comparing unit 3 without passing the signal through the column amplifier 38, when the incident light quantity is large. In addition, when the incident light quantity is small, the imaging apparatus can amplify the pixel signal in the column amplifier 38, and then give the pixel signal to the comparing unit 3.

Incidentally, in the example of FIG. 3, an amplification ratio of the column amplifier 38 is negative, and accordingly the positive and negative values of the pixel signal and a reset signal are inverted when the circuit which outputs the signal through the column amplifier 38 is switched to the circuit which bypasses the column amplifier 38. Because of this, the imaging apparatus needs to be configured to vertically invert the ramp signal at the same time when having switched the circuit to the bypass circuit, according to the same method as that in the description of the third embodiment.

In addition, the imaging apparatus can be configured not only so as to vertically invert the ramp signal but also change a potential value of the ramp signal such as a starting voltage, when having switched the circuit to the circuit which bypasses the column amplifier 38. The amplitude of the reset signal is small, and accordingly the voltage of the reset signal becomes close to a power supply voltage or the ground voltage. If the starting voltage of the ramp signal is constant, a difference between the starting voltage of the ramp signal and an output voltage of the reset signal becomes very large in any one of modes in the case where the column amplifier 38 is bypassed and in the case where the column amplifier 38 is not bypassed. Thereby, it takes a long time until potentials of both of the signals coincide with each other at the time of the A/D conversion of the reset signal, and it is assumed that a working speed of the circuit becomes slow. Accordingly, the imaging apparatus can be configured so as to change the starting voltage of the ramp signal as well, when having switched between a circuit which bypasses the column amplifier 38 and a circuit which does not.

It is also acceptable to use a non-inverting amplifier which has a positive voltage amplification ratio as the column amplifier 38 so that the positive and negative values of the pixel signal and the reset signal are not reversed in the case where the column amplifier 38 is bypassed or in the case where the column amplifier 38 is not bypassed.

The imaging system can be configured so that the above described switching operation is performed based on ISO sensitivity. For instance, in the imaging system 800, the imaging apparatus may be configured so as to switch between the presence and absence of the bypass, as a method of making the signal bypass the column amplifier 38 when the ISO sensitivity is low, and amplifying the signal in the column amplifier 38 when the ISO sensitivity is high.

The configuration is not limited to a switching method using a switch, but can be achieved by various configurations which can obtain a predetermined amplification ratio. For instance, a similar effect can be obtained also by a configuration of controlling the amplification ratio so that the amplification ratio is changed by using the column amplifier 38 of which the amplification ratio is variable.

In the first to third embodiments, the RAMP wiring 11 into which the ramp signal is input has been connected to the comparator 21 through the input capacitor 25, but the present invention is not limited to the configuration. For instance, a buffer which is formed of a source follower circuit may be arranged between the RAMP wiring 11 and the input capacitor 25.

In the first to third embodiments, the configuration is also usable that has a plurality of stages by arranging a gain stage formed of an amplifier circuit using a transistor in the output of the comparator, which constitute a common source circuit, for instance.

The comparator according to the present exemplary embodiment can have an input voltage range larger than the case where a conventional offset cancel technique is used, while reducing an offset voltage of a comparator circuit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-236462, filed Nov. 15, 2013, which is hereby incorporated by reference herein in its entirety.

What is claimed is:

1. An imaging apparatus comprising:
a plurality of pixels arranged in two dimensions, to output a pixel signal based on an incident light;
a readout circuit configured to be input the pixel signal, and to output the pixel signal processed;
a reference signal generating unit configured to output a ramp signal; and
an analog-digital converter,
wherein
the analog-digital converter is configured to convert the pixel signal into a digital signal, the digital signal having a value corresponding to an amplitude of the analog signal, and wherein the analog-digital converter comprises:
a comparator having a first input terminal, a second input terminal and an output terminal;
a first switch having terminals, one terminal of the terminals connected to the first input terminal, the other terminal of the terminals connected to the output terminal, and short-circuiting between the output terminal and the first input terminal at a conducting state;
a first capacitor having terminals, one terminal of the terminals of the first capacitor receiving the pixel signal, the other terminal of the terminals of the first capacitor being connected to the first input terminal and the one terminal of the first switch;
a second capacitor having terminals, one terminal of the terminals of the second capacitor being connected to the second input terminal, the other terminal of the terminals of the second capacitor receiving the ramp signal; and
a second switch having terminals, one terminal of the terminals of the second switch being connected to the one terminal of the second capacitor and the second input terminal, the other terminal of the terminals of the second switch receiving a fixed voltage,
wherein the analog-digital converter inputs signals output from the readout circuit through the first capacitor, as the pixel signal, and inputs the ramp signal from the reference signal generating unit through the second capacitor.

2. The imaging apparatus according to claim 1, wherein the readout circuit further comprises an amplifier configured to amplify or non-amplify selectively the voltage of the pixel signal.

3. The imaging apparatus according to claim 1, wherein the analog-digital converter performs a circuit operation in a first state such that the first switch is set at a non-conductive state after being set at the conducting state, to hold an output voltage of the comparator by the first capacitor, and
a second state such that the first switch is set at a non-conducting state, and the other terminal of the second switch receives the ramp signal.

4. The imaging apparatus according to claim, wherein the fixed voltage and the ramp signal are supplied through a common wiring connected to the other terminal of the second switch.

5. The imaging apparatus according to claim 1, wherein,
in the first state, the second switch is further set at a conducting state, to input the fixed voltage to the one terminal of the second capacitor and the second input terminal, and,
in the second state, the second switch is further set at a non-conducting state after the first state, to hold a voltage difference between the one terminal and the other terminal of the second capacitor.

6. An imaging system comprising:
an imaging apparatus; and
an image processing unit,
wherein the imaging apparatus comprises:
a plurality of pixels arranged in two dimensions, to output a pixel signal based on an incident light;
a readout circuit configured to be input the pixel signal, and to output the pixel signal processed;
a reference signal generating unit configured to output a ramp signal; and
an analog-digital converter,
wherein
the analog-digital converter is configured to convert the pixel signal into a digital signal, the digital signal having a value corresponding to an amplitude of the pixel signal, and wherein the analog-digital converter comprises:
a comparator having a first input terminal, a second input terminal and an output terminal;
a first switch having terminals, one terminal of the terminals connected to the first input terminal, the other terminal of the terminals connected to the output terminal, and short-circuiting between the output terminal and the first input terminal at a conducting state;
a first capacitor having terminals, one terminal of the terminals of the first capacitor receiving the pixel signal, the other terminal of the terminals of the first capacitor being connected to the first input terminal and the one terminal of the first switch;
a second capacitor having terminals, one terminal of the terminals of the second capacitor being connected to the second input terminal, the other terminal of the terminals of the second capacitor receiving the ramp signal; and
a second switch having terminals, one terminal of the terminals of the second switch being connected to the one terminal of the second capacitor and the second input terminal, the other terminal of the terminals of the second switch receiving a fixed voltage, and
wherein the analog-digital converter is input signals output from the readout circuit through the first capacitor, as the pixel signal, and is input the ramp signal from the reference signal generating unit through the second capacitor.

7. A controlling method of an imaging apparatus, the imaging apparatus comprising:

a plurality of pixels arranged in two dimensions, to output a pixel signal based on an incident light;
a readout circuit configured to be input the pixel signal, and to output the pixel signal processed;
a reference signal generating unit configured to output a ramp signal; and
an analog-digital converter,
wherein
the analog-digital converter is configured to convert the pixel signal into a digital signal, the digital signal having a value corresponding to an amplitude of the pixel signal, and wherein the analog-digital converter comprising:
a comparator having a first input terminal, a second input terminal and an output terminal;
a first switch having terminals, one terminal of the terminals connected to the first input terminal, the other terminal of the terminals connected to the output terminal, and short-circuiting between the output terminal and the first input terminal at a conducting state;
a first capacitor having terminals, one terminal of the terminals of the first capacitor receiving the pixel signal, the other terminal of the terminals of the first capacitor being connected to the first input terminal and the one terminal of the first switch; and
a second capacitor having terminals, one terminal of the terminals of the second capacitor being connected to the second input terminal, the other terminal of the second capacitor receiving the ramp signal;
wherein the method comprising:
turning ON the first switch during a period of resetting the second capacitor.

8. The controlling method according to claim 7,
the comparator further comprising;
a second switch having terminals, one terminal connected to the second input terminal and the one terminal of the second capacitor, the other terminal of the terminals connected to the other terminal of the second capacitor, and turning On to short-circuit between the non-inverting terminal and the one terminal of the second capacitor, and the other terminal of the second capacitor;
wherein
the resetting the second capacitor is performed by turning ON the second switch.

* * * * *